US 6,269,537 B1

(12) United States Patent
Kimura et al.

(10) Patent No.: US 6,269,537 B1
(45) Date of Patent: Aug. 7, 2001

(54) METHOD OF ASSEMBLING A PERIPHERAL DEVICE PRINTED CIRCUIT BOARD PACKAGE

(75) Inventors: Ryan Kimura, San Jose; James Farquhar, Cordonado; Jeffrey Allen, Pleasanton; Michael Chao, San Jose; Stephen Hatch, Mountain View; Scott Herbert, Pleasanton; Brandt Weibezhan, San Ramon; Iggoni Fajardo, Freemont, all of CA (US)

(73) Assignee: Methode Electronics, Inc., Chicago, IL (US)

( * ) Notice: Subject to any disclaimer, the term of this patent is extended or adjusted under 35 U.S.C. 154(b) by 0 days.

(21) Appl. No.: 09/362,832

(22) Filed: Jul. 28, 1999

(51) Int. Cl.$^7$ ...................................... H05K 3/30
(52) U.S. Cl. ................... 29/832; 29/825; 29/840; 29/527.5; 29/592.1; 29/DIG. 29; 361/737; 360/97.01; 264/274; 264/279; 164/900; 174/35 R
(58) Field of Search ................. 29/832, 840, 841, 29/DIG. 29, 883, 843, DIG. 3, DIG. 5, DIG. 47, 592.1, 527.5, 825; 164/113, 900; 264/274, 279; 174/35 R, 35 GC; 360/97.01, 97.02, 265.7; 361/685, 736, 737

(56) References Cited

U.S. PATENT DOCUMENTS

| | | | |
|---|---|---|---|
| 4,694,881 | 9/1987 | Busk ................................ | 164/113 |
| 4,694,882 | 9/1987 | Busk ................................ | 164/113 |
| 4,738,024 | * 4/1988 | Eberhardt ............................. | 29/840 |
| 4,964,455 | 10/1990 | Meyer ................................ | 164/468 |
| 5,005,106 | 4/1991 | Kiku ................................ | 361/424 |
| 5,014,160 | 5/1991 | McCoy, Jr. ............................. | 361/424 |
| 5,040,589 | 8/1991 | Bradley et al. ....................... | 164/113 |
| 5,108,155 | 4/1992 | Hettes et al. ........................... | 300/21 |
| 5,206,796 | 4/1993 | Thompson et al. .................... | 361/424 |
| 5,242,310 | * 9/1993 | Leung ................................. | 361/737 |
| 5,244,840 | 9/1993 | Kodai et al. ........................... | 437/214 |
| 5,252,782 | 10/1993 | Cantrell et al. ...................... | 174/35 R |
| 5,323,299 | 6/1994 | Weber ................................ | 361/818 |
| 5,333,100 | 7/1994 | Anhalt ................................ | 361/818 |
| 5,335,147 | 8/1994 | Weber ................................ | 361/818 |
| 5,339,222 | * 8/1994 | Simmons et al. .................. | 174/35 R |
| 5,397,857 | 3/1995 | Farquhar et al. .................... | 174/52.1 |
| 5,476,387 | * 12/1995 | Ramey et al. ....................... | 361/737 |
| 5,502,892 | * 4/1996 | Lien ........................................ | 29/841 |
| 5,505,628 | 4/1996 | Ramey et al. ....................... | 439/76.1 |
| 5,572,408 | 11/1996 | Anhalt et al. ........................ | 361/737 |
| 5,687,064 | 11/1997 | Nichols ................................. | 361/752 |
| 5,711,366 | 1/1998 | Mihelich et al. ..................... | 164/312 |
| 5,819,839 | 10/1998 | Mihelich et al. ..................... | 164/312 |

(List continued on next page.)

FOREIGN PATENT DOCUMENTS

358042211 * 3/1983 (JP) ........................................ 29/605

OTHER PUBLICATIONS

"Is Metal Molding in Your Future?" by Tim Creasy—Plastics Technology, Apr. 1999, pp. 64–68.

Primary Examiner—Lee Young
Assistant Examiner—Rick Kiltae Chang
(74) Attorney, Agent, or Firm—Karl D. Kovach; David L. Newman

(57) ABSTRACT

A PCB package for shielding electromagnetic radiation from exiting or entering the package. In one embodiment the package includes first and second electrically conductive covers and first and second electrically conductive frames. The first frame electrically connected to the first cover and the second frame electrically connected to the second cover. The first frame is then electrically connected to the second frame. The first and second frames can be made of electrically conductive plastics or metals or any other electrically conductive materials. Methods of assembling the packages of the various embodiments are also set forth.

4 Claims, 7 Drawing Sheets

U.S. PATENT DOCUMENTS

| | | | |
|---|---|---|---|
| 5,832,982 | 11/1998 | Williams et al. | 164/61 |
| 5,836,372 | 11/1998 | Kono | 164/113 |
| 5,878,804 | 3/1999 | Williams et al. | 164/61 |
| 5,900,080 * | 5/1999 | Baldi et al. | 29/527.5 |
| 5,901,044 * | 5/1999 | Marro | 361/736 |
| 5,920,460 | 7/1999 | Oldendorf et al. | 361/753 |
| 5,923,026 | 7/1999 | Onoda | 235/492 |
| 5,987,741 | 11/1999 | Banakis et al. | 29/842 |
| 6,137,050 * | 10/2000 | Jochheim | 174/35 R |
| 6,151,198 * | 11/2000 | Prater et al. | 360/265.7 |

* cited by examiner

METHOD OF ASSEMBLING A PERIPHERAL DEVICE PRINTED CIRCUIT BOARD PACKAGE

BACKGROUND OF THE INVENTION

The present invention relates to memory media and input/output device packages. Typically, the package holds a printed circuit board, where the device conforms to the standards set by Personal Computer Memory Card International Association (PCMCIA), Japan Electronic Industry Development Association (JEIDA), International Organization for Standardization (ISO), and et cetera for peripheral devices.

DISCUSSION OF THE BACKGROUND

The current trend in the computing hardware, telecommunications and electronics industries is to miniaturize components and devices and to place as many of the components and devices next to each other so as to provide quality technical performance in a small package. Such packages have typically been formed from steel with plastic molded frames. Such packages do not provide a rigid, robust, and precise datum surface upon which a precision assembly may be manufactured. Certain Personal Computer (PC) card, compact flash or small form factor cards are needed that provide a rigid, accurate structure support for applications such as mini disk drives. The current steel covers with plastic molded frames do not provide enough torsional resistance to external forces, for instance, for such precision PC card applications, liquid crystal diode (LCD) displays, hinges, security devices, personal digital assistants (PDA), digitization of analog information scanners, internet connections, and other wireless communication applications. Also, traditional molding methods result in too much shrinkage, thus forming surfaces not having accurate dimensions. Therefore, it is desired to provide the manufacture of components such as PC cards using materials and compounds that may provide an accurate datum plane due to accurately manufactured parts which are stiff and strong.

Current packages also include hardware that conveys electricity, such as a wire or printed circuit board (PCB), radiates electromagnetic radiation. The hardware is also susceptible to electromagnetic radiation radiated from other sources. The electromagnetic radiation effects the hardware by corrupting or altering the electrical signal that the component conveys. Such corruption of an electrical signal in a component is not tolerable. The power and associated affect of the electromagnetic radiation field diminishes with distance from the source of the electromagnetic radiation. Therefore, the closely placed electronic components and devices disadvantageously influence each other by radiating electromagnetic fields. Placement of electronic components and devices in close proximity to each other would be acceptable if the effects of the electromagnetic radiation emanating from each device could be muted or lessened to a degree where the electromagnetic radiation emanating from each device does not corrupt the electrical signals being conveyed by other components or devices.

Prior art PCMCIA cards typically have two sheet metal covers which are joined together by a plastic frame molded around each cover, as disclosed in U.S. Pat. No. 5,397,857. U.S. Pat. No. 5,397,857 is hereby incorporated herein by reference. The electrically conductive, sheet metal of the top and bottom covers provide a shielding effect against the transmission of electromagnetic radiation through the top and bottom covers. A seam is formed where the top cover and the bottom cover meet. Due to undulations or unevenness of the sheet metal near the edges of the covers near the seams, some electromagnetic radiation may be able to pass through the region of the seam covered only by plastic material which is, in its natural state, electrically nonconductive, where the plastic material does not provide a shielding effect against electromagnetic radiation, whether the electromagnetic radiation is radiated from components within the PCMCIA card or whether the radiation is radiated from other components external to the PCMCIA card and passes through the seam and into the interior of the PCMCIA card. Such leakage issues are also present in compact flash packages, miniature cards, and other PC card packages, where the term PC card package is inclusive of any package which can contain electrical components, such as the devices described above, and is not to be limited by any narrow definition of the term as used in trade groups.

Other prior art packages employ a clip or veneer of conductive material positioned around the side edges of the package so as to shield against electromagnetic radiation. Another or art solution, such as U.S. Pat. Nos. 5,505,628 and 5,476,387, employ the use of covers that have mechanical overlaps which attach one cover to the other cover at discrete intervals along the side edge of the package. The mechanical overlaps electrically ground the two covers to each other. The mechanical overlaps traverse or cross over the side edge of the package, as such, only intermittent shielding is provided, which not acceptable. Such solutions, however, add to the size, complexity, material cost, and labor cost of the package.

Thus, there is a need for a simple to manufacture and assemble package that shields the seam of the device package from electromagnetic radiation.

SUMMARY OF THE INVENTION

It is an object of the invention to provide a peripheral device package that meets Personal Computer Memory Card International Association (PCMCIA), Japan Electronic Industry Development Association (JEIDA), Compact Flash Association (CFA), and International Organization for Standardization (ISO) standards. It is a further object of the present invention to provide a package holding a printed circuit board which has a rigid accurate datum on which to build a product on and also reduces the strength of the electromagnetic field emanating from the package and at the same time reduces the influence of electromagnetic radiation, from other sources, on the printed circuit board held within the package.

It is also an object of the present invention to provide a PC card package formed from materials that provide an accurate rigid datum for applications that require precision assemblies.

In one form of the invention the device package takes the form of first and second electrically conductive covers, where each cover has a perimeter. A first electrically conductive frame is attached to the first electrically conductive cover along a portion of the perimeter of the first electrically conductive cover and a second electrically conductive frame is attached to the second electrically conductive cover along a portion of the perimeter of the second electrically conductive cover. The first and second electrically conductive frames are then attached to each other so as to form an electrical connection between the first and second electrically conductive frames. The first and second electrically conductive covers are then secured to each other via the electrically conductive first and second frames. Thus, forming an electrical connection between the first and second electrically conductive covers.

In yet another form of the invention, the invention is a method of assembling the inventive apparatus described above. The inventive method includes the steps of injection molding a first material around a portion of the perimeter of the first electrically conductive cover so as to form the first electrically conductive frame attached to the perimeter of the first electrically conductive cover, where the first electrically conductive cover is electrically connected to the first electrically conductive frame. Likewise, another step includes the injection molding of a second material to form the second electrically conductive frame attached to the second electrically conductive cover in a manner similar to that described in regard to the first electrically conductive cover and frame. Then the two sub-assemblies of an integrated cover and frame are brought together, where the first and second electrically conductive frames are bonded to each other so as to form an electrical connection between each of the parts.

Another embodiment of the method to form a part having a stiff structure thus forming a datum surface. An accurate datum surface is critical to the performance of the component mounted thereto and to the overall performance of the entire package. The method including the steps of placing a metallic material into a molding machine, converting the metallic material to a thixotropic state; transferring the metallic material in the thixotropic state to a mold, where the mold has a portion of an object either fully or partially inserted into the mold; changing state of the metallic material in the thixotropic state to a solid state while being in the mold so as to form the part; and removing the part from the mold, the part having the object bonded thereto.

Thus, Applicants' invention is superior to the prior art. Applicants' invention provides a device package that prevents or lessens the strength of an electromagnetic field passing through the seam of the device, as well as preventing or lessening the strength of the electromagnetic field passing through the covers of the device package, while decreasing the part count and providing an easy to assemble package. Therefore, Applicants' invention achieves the desired objectives. The prior art fails to disclose a PCB carrying package that shields the PCB from electromagnetic radiation both through the cover and the frame of the package where a portion of the frame of the package is exposed to the environment along the seam, which provides the desired result. Such structural features distinguish Applicants' invention, structurally and functionally, over the prior art of U.S. Pat. No. 5,397,857.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
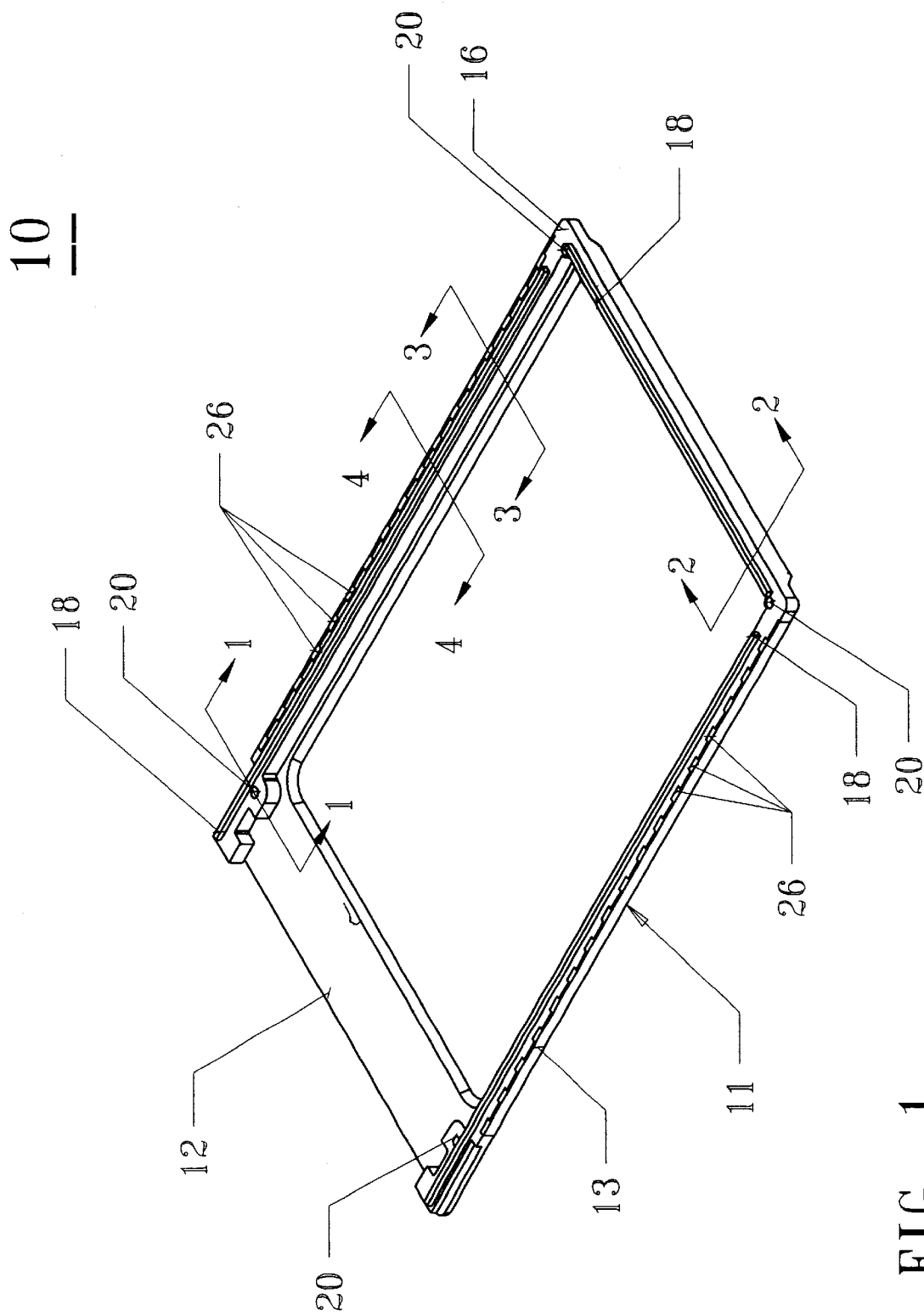
FIG. 1 is a perspective view of the first cover of the package.

Referring now to the drawings, wherein like reference numerals designate identical or corresponding parts throughout the several views, and more particularly to FIGS. 1–11 thereof, a first embodiment of the present invention is a PCMCIA style peripheral device package 10 displayed therein. FIG. 1 is a perspective view of a first cover 12 and a first frame 16 assembled together forming a first half 11 of the package 10 which displays the interior of the first half 11. Additionally, raised portions or ridges 18 and pits 20 are shown which fit with complimentary features on a second half 30 (see FIG. 6) of the package 10 to which the first half 11 is attached at the final stage of manufacture. The first cover 12 has a perimeter 13. Along portions of the perimeter 13 of the first cover 12 are distributed fingers 26. The first cover 12 and the first frame 16 are constructed of an electrically conductive material. The first cover 12 can be constructed of an electrically conductive, stamped, sheet metal material, or any other suitable electrically conductive material. The first frame 16 can be constructed of an electrically conductive plastic material such as grades A230 or B230 of VECTRA liquid crystal polymer produced by the Advanced Materials Group of the Hoechst Celanese Corporation, or any other suitable electrically conductive material.

Figure 2:
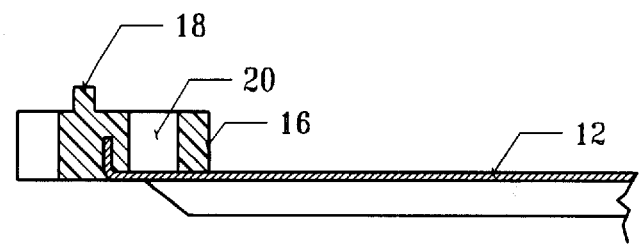
FIG. 2 is a cross-sectional view taken along section line 1—1 of FIG. 1.
Figure 3:
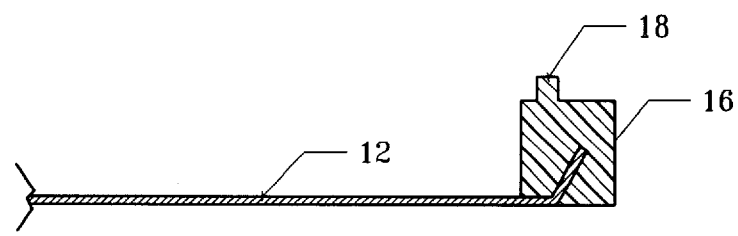
FIG. 3 is a cross-sectional view taken along section line 2—2 of FIG. 1.
Figure 4:
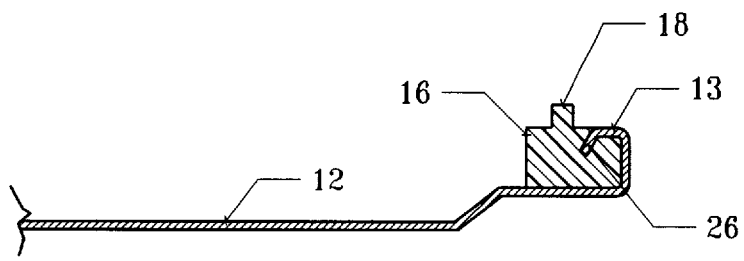
FIG. 4 is a cross-sectional view taken along section line 3—3 of FIG. 1.
Figure 5:
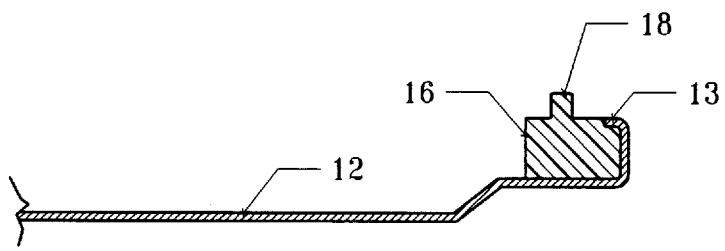
FIG. 5 is a cross-sectional view taken along section line 4—4 of FIG. 1.

FIG. 2 is a cross-sectional view taken along section line 1—1 of FIG. 1. FIG. 2 displays part of the connection of the first cover 12 to the first frame 16. FIG. 2 shows further details of the ridges 18 and pits 20 of the first frame 16. FIG. 3 is a cross-sectional view taken along section line 2—2 of FIG. 1. FIG. 3 shows details of the connection between the first frame 16 and the first cover 12, and the ridge 18. FIG. 4 is a cross-sectional view taken along section line 3—3 of FIG. 1. FIG. 4 shows details of the connection between the first cover 12 and the first frame 16 and how the first cover 12 wraps around the first frame 16. FIG. 4 also shows details of the embedding of fingers 26 into the first frame 16. FIG. 5 is a cross-sectional view taken along line 4—4 of FIG. 1. FIG. 5 shows an example of the intermittent spacing of fingers 26 by way of the absence of fingers 26 at the present cross-section. In order to facilitate bonding, portions of the top cover perimeter 13 are bent to conform to the shape of the top frame 16. Additionally, in a preferred embodiment the fingers 26 become embedded in the top and bottom frames 16 and 18 during the bonding and/or molding process to form an integral frame-cover element which is the first half 11 of the package 10. The top cover 12 being wrapped around the top frame 16 also serves to strengthen the package 10. However, having multiple fingers 26 is not required by the present invention and any portion of the cover such as an edge of the cover embedded in the plastic frame may provide a strong and secure package.

Figure 6:
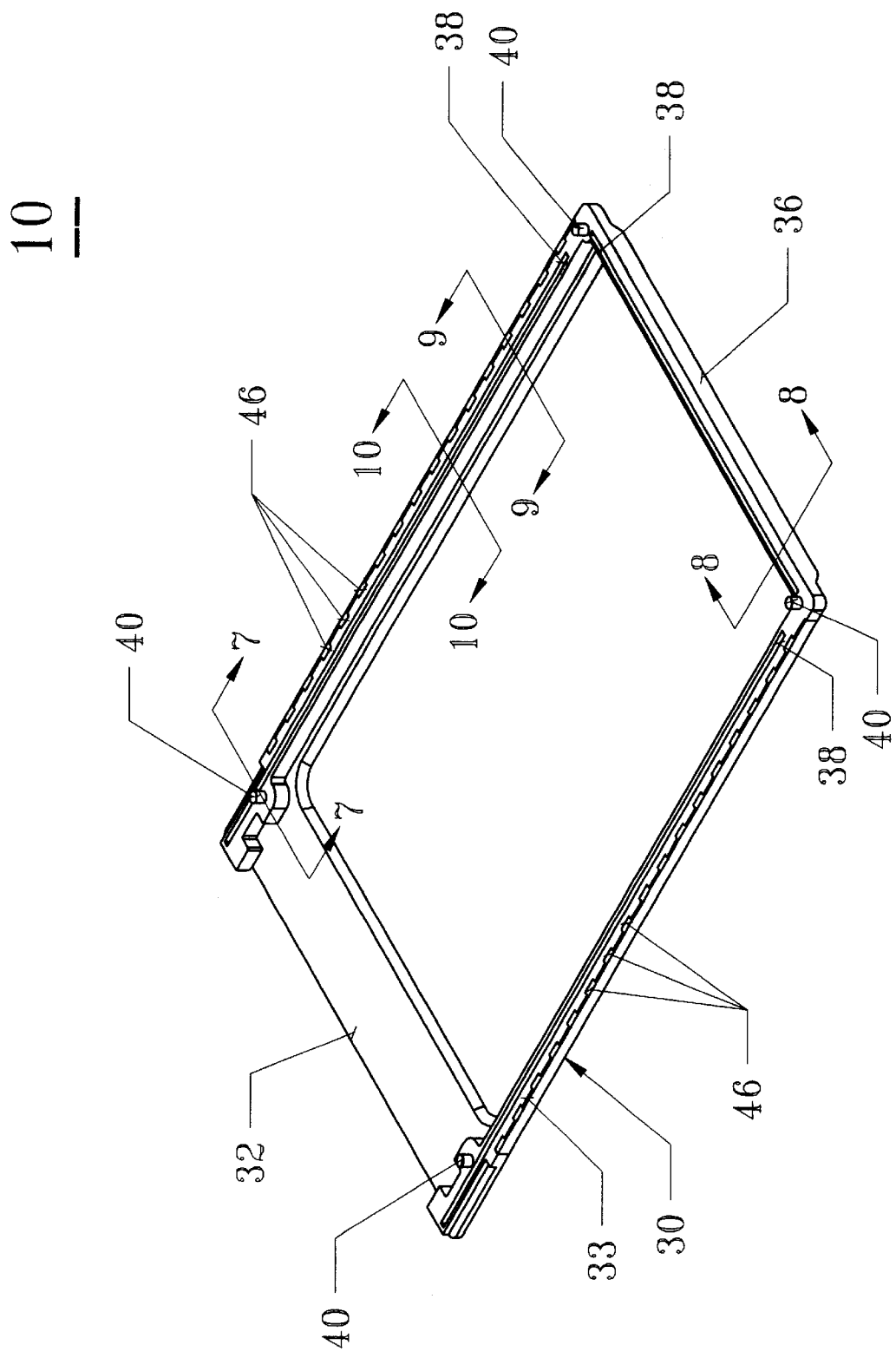
FIG. 6 is a perspective view of the second cover of the package.
Figure 7:
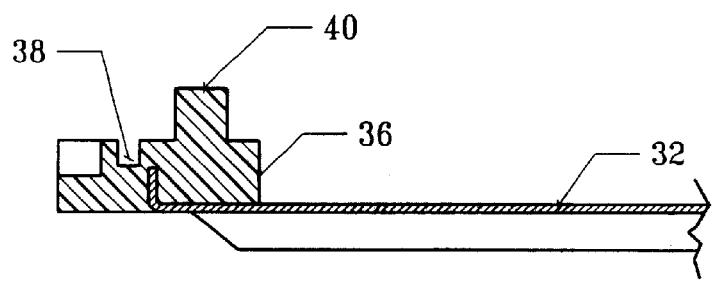
FIG. 7 is a cross-sectional view taken along section line 1—1 of FIG. 6.
Figure 8:
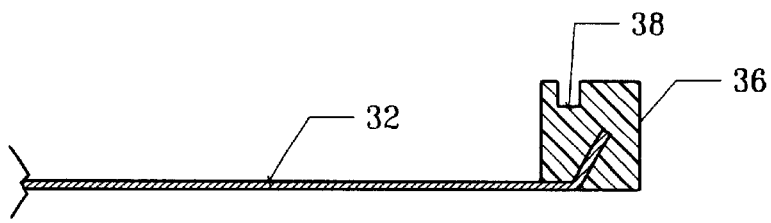
FIG. 8 is a cross-sectional view taken along section line 2—2 of FIG. 6.
Figure 9:
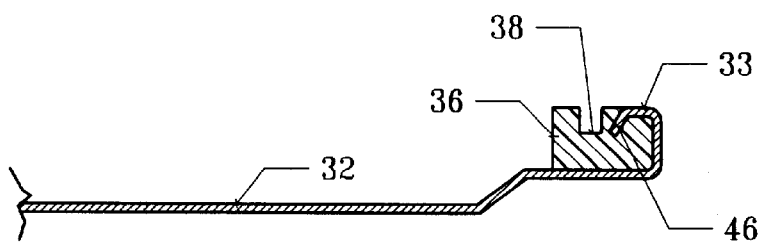
FIG. 9 is a cross-sectional view taken along section line 3—3 of FIG. 6.
Figure 10:
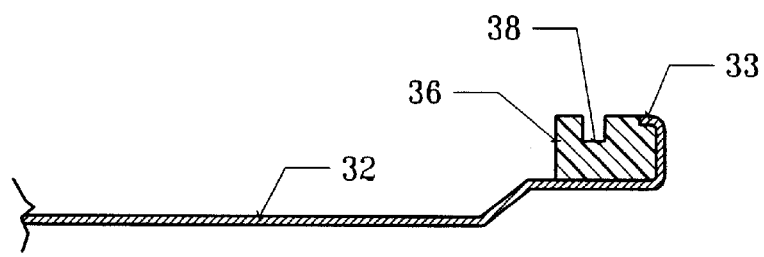
FIG. 10 is a cross-sectional view taken along section line 4—4 of FIG. 6.

FIGS. 6–10 display the second half 30 of the package 10 that mates with the first half 11 previously discussed. FIG. 6 is a perspective view of the second half 30 which includes a second cover 32 and a second frame 36. The second cover includes perimeter portions 33 and finger 46 along portions of the perimeter 33. The second frame 36 includes recess 38 and plugs 40. The recesses 38 and plugs 40 are dimensioned so as to conform to and mate with the ridges 18 and pits 20 of the first half 11. FIG. 7 is a cross-sectional view taken along line 7—7 of FIG. 6. FIG. 7 displays a portion of the connection between the second cover 32 and the second frame 36 along a portion of the perimeter 33 of the second cover 32. FIG. 7 also displays a cross-sectional shape of the recess 38. FIG. 8 is a cross-sectional view taken along line 8—8 of FIG. 6. FIG. 8 displays the embedding of a portion of the perimeter of the second cover 32 into the second frame 36. Further shown in FIG. 8 is the recess 38. FIG. 9 is a cross-sectional view taken along line 9—9 of FIG. 6. FIG. 9 displays the fingers 46 along the perimeter 33 of the second cover 32 being embedded in the second frame 36. Also shown in FIG. 9 is the recess 38. FIG. 10 is a cross-sectional view taken along line 10—10 of FIG. 6. FIG. 10 displays a portion of the perimeter 33 of the second cover 32 in a location where fingers 46 are not present, as compared to FIG. 9. Except for two differences, the shape and materials of construction of the second half 30 are the same as that used for the first half 11. The two difference between the fist half 11 and the second half 30 of the package 10 are as follows: the first half 11 has ridges 18 and pits 20, where, in there place, the second half 30 has recesses 38 and plugs 40.

The manufacture of the PCMCIA style peripheral device package 10 is accomplished as follows (reference will be made only to the first half 11 of the package 10 when the manufacturing steps are also identical for the second half 30 of the package 10): first, the first cover 12 is stamped. The first frame 16 is then formed to the first cover 12. This is accomplished by an injection molding process. The first cover 12 is placed into a mold, where it is secured into position. The securing of the first cover 12 is accomplished by the geometry and dimensions of the first cover 12. The first cover 12 is stamped to be slightly wider than the mold. Thus, the first cover 12 is slightly sprung when it is placed into the mold, and remain in the proper position for the injection molding process. Certainly, there is no requirement that the first cover 12 be secured in the mold as described above. Any means of securing will suffice. The same manufacturing steps are employed to attach the second cover 32 to the second frame 36.

The conductive plastic which forms the first frame 16 is then shot into the mold. As the conductive plastic first frame 16 is molded, portions of edges of the cover 12 such as the metal fingers 26 of the first cover 12 become embedded in the first frame 16 so that separation of the first cover 12 from the first frame 16 cannot take place. However, as discussed above, the first frame 16 can be made of other electrically conductive material. The same manufacturing steps are employed to attach the second cover 32 to the second frame 36.

Figure 11:
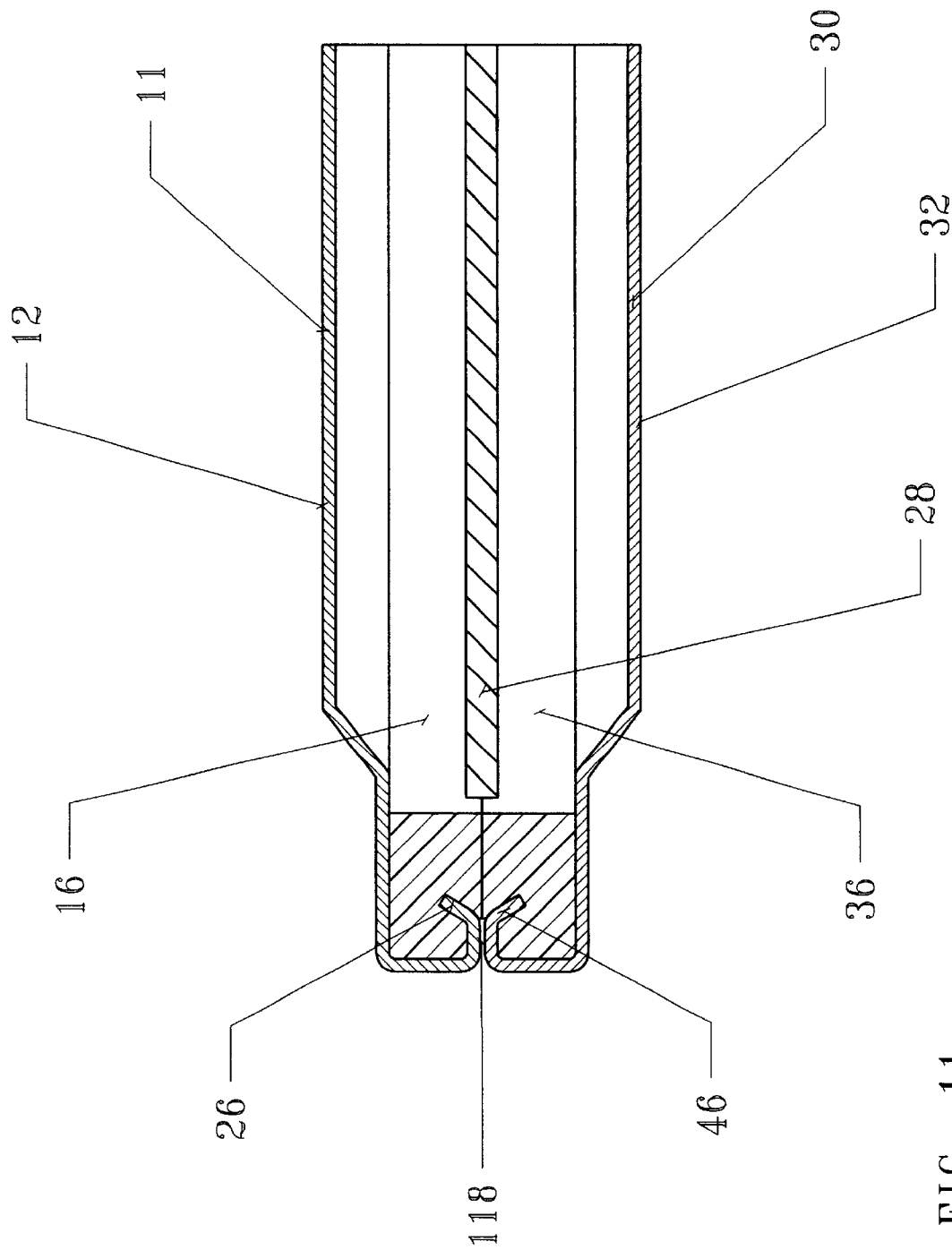
FIG. 11 is a cross-sectional view taken along a side edge location of the assembled package including a memory card secured within the package.

Once both the first half 11 and the second half 30 of the package 10 have been made, the first frame 16 of the first half is positioned so as to face and contact the bottom frame 36 of the second half 30. The ridges 18 and pits 20 of the first half 11 mesh with the complimentary recesses 38 and plugs 40 of the second half 30. The assembly is then subjected to a sonic welding process. As a result of the sonic welding process, the first frame 16 is bonded to the second frame 36. FIG. 11 is a cross-sectional view of the assembled package 10 where the cross-section is taken along a section line (similar to lines 3—3 or 4—4) going through a side edge of the package 10. FIG. 11 displays the printed circuit board (PCB) 28 positioned between the first half 11 and the second half 30. Also shown are the fingers 26 of the first cover 12 and the fingers 46 of the second cover 32. FIG. 11 also shows a seam 118 which is present between the first half 11 and the second half 30 after assembly. The seam 118 is the pathway through which unacceptable levels of electromagnetic radiation would enter the package 10 and exit the package 10 if the first frame 16 and the second frame 36 were not made of an electrically conductive material. The welded conductive plastic frames 16 and 36 form a permanent bond which encases the PCB 28. However, the gap shown between the covers 12 and 32 near the seam 118 does not necessarily extend around the entire circumference of the package 10. As discussed earlier, undulation or unevenness exist at the edge of the covers 12 and 32. Therefore, even though gaps may exist at discrete locations, at other locations the covers 12 and 32 may be contacting one another and as such provide sufficient shielding at that location.

Thus, the first and second covers 12 and 32 are secured to the respective first and second frames 16 and 36, where the frames 16 and 36 are welded to each other. This ensures that the first cover 12 is electrically connected to the first frame 16, and that the first frame 16 is electrically connected to the second frame 36, and that the second frame 36 is electrically connected to the second cover 32. Thus, the first cover 12 is electrically connected to the second cover 32. Therefore, the PCB 28 is shielded from electromagnetic fields located outside of the package 10 even in the region of the seam 118 located between the first and second halves 11 and 30. Additionally, electromagnetic fields generated by the PCB 28 are substantially contained within the package 10.

Furthermore, the assembly process ensures that the memory card package 10 will be very reliable and durable. It should be noted, that the bonding process between the elements of the package 10 may be performed by resistance welding.

Additionally, one of the frames such as frame 16 which has the ridges 18 can be formed of conductive plastic and the frame 36 which has the grooves 38 can be formed of nonconductive plastic as long as the length of the ridges 18 is long enough so when the two covers are assembled, the ridges 18 extend past the edge of the cover 32 so as to prevent radio frequency interference/electro-magnetic interference (RFI/EMI) leakage through the seam 118. A grounding clip (not shown) can be placed inside the package so as to make electrical connection between the two covers.

As a further option, the electrically conductive material of the first and second frames can be a metallic material. In such a situation, similar to the explanation above, the first cover is positioned in a mold or die into which the metallic material is die cast. As the metallic material flows into the mold, it surrounds portions of edges of the frame such as the fingers of the first cover so as to form the first frame. Upon solidification of the metallic material, the integrated first cover and first frame assembly form a first half of the package. The first cover is then in electrical contact with the first frame. The same procedure applies to the second cover and second frame of the second half. The remaining assembly procedures are the same as discussed above in regard to the first and second frames constructed of plastic material.

As good as die casting is to produce complicated shapes having a quality surface finish, die casting, typically, suffers from the ill effects of entrained air. Thus, comprimising the structural integrity of the die cast part. Furthermore, the grain structure of the material is not refined, thus lowering the strength of the die cast part.

A preferred method of forming metallic frames, covers, and datum surfaces is by way of the thixomolding process. The thixomolding process is a way to mold thixotropic materials such as aluminum, magnesium, and zinc, and is a tradename of Thixomat Inc. of Ann Arbor, Mich. Parts formed by this process have material properties which are between those of parts formed by forging and parts formed by die casting. However, forged parts are more expensive, due to the high price of forging molds. Thixomolding is explained in U.S. Pat. Nos. 5,711,366; 5,819,839; 5,836,372; 5,878,804; 4,964,455 all of which are hereby incorporated herein by reference.

Due to the ability of metallic thixotropic materials to become more liquid when sheared, similar to a polymer, these materials can be formed with machinery that is more like the injection molding machinery used for polymers instead of the die-casting methods traditionally used for molding metallic materials. Unlike die casting where metal is first put into a molten state, in the thixomolding process metal pellets are transferred into the thixomolding machine. As the pellets travel through the machine they are heated and sheared by an auger so as to place the pellets in a semi-solid, thixotropic state forming a slurry. The slurry is then injected into the mold, where the mold has been pre-sprayed with a mold-release agent as is well known in the art. As such, the use of thixotropic materials allow for high speed injection molding of the thixotropic materials much like a polymer. Like a polymer, the material in the thixotropic state are able to be molded into wall thicknesses which are thinner than can be achieved with die cast metals. Additionally, the solidified thixotropic material has mechanical material properties that exceed those of most typical polymers. Furthermore, since the material is placed into the mold while the material is in the thixotropic state the material is more dense than it would be if it were die cast. Thus, the thixotropic material minimizes the voids and shrinkage that accompanies most die cast parts. Such a material results in an end product which is stronger than it otherwise would be.

Once in the metallic material is in the thixotropic state, thirty or forty percent of the mass is in the liquid phase and the remaining portion is in the solid phase. The solid portion typically has small spherically-shaped nodules suspended within the liquid phase. Semisolid metals heated to a thixotropic state exhibit unique rheological properties due to their non-dendritic, or spherical microstructure. By heating the metals to a semisolid range and then agitating the semisolid alloy, the dendritic microstructure normally found is eliminated and replaced by the spherical microstructure. Upon solidification, the metal exhibits a fine equiaxed microstructure. The grain structure of the of the semisolid-formed metal is an intermediate sized grain structure which is larger than forged grain structure and smaller than cast grain structures.

Thus, for example viewing FIGS. 1–11, the frames 16 and 36 can be formed by flowing thixotropic material around edges of the cover such as the fingers 26 of the covers 12 and 32. The resulting parts created from the thixomolding process has as-molded dimensions which when compared to the dimensions of the mold itself are nearly identical, and come closer to matching the mold dimensions than does nearly any other process. Furthermore, the frame is stiffer than a frame constructed of a conductive plastic material, and, also, provides for shielding against EMI/RFI. The stiff, strong structure provides for a robust part which is dimensionally stable when subject to external forces. Thus, the part can be used as a datum surface since it is so dimensionally accurate.

In the electronics industry, for example, a miniature, 340-MB hard drive that is the size of a large coin is designed to fit within a CompactFlash Type II package, as described in U.S. patent application Ser. No. 09/169,124, now U.S. Pat. No. 6,109,940, which is hereby incorporated herein by reference. The housing member of such a package must have a surface which is planar and flat within exacting tolerance bands so as to properly mount the miniature hard drive. Furthermore, the entire structure must be stiff so as to maintain the accurate dimensions. Such a structure ensures the continued performance of the miniature hard drive.

Thus, thixotropic materials, via the thixomolding process, are able to form parts having thin wall portions, and the dimensions of the parts are able to be held to close tolerances. The metallic material provides superior shielding along with high mechanical material properties such as stiffness.

Figure 12:
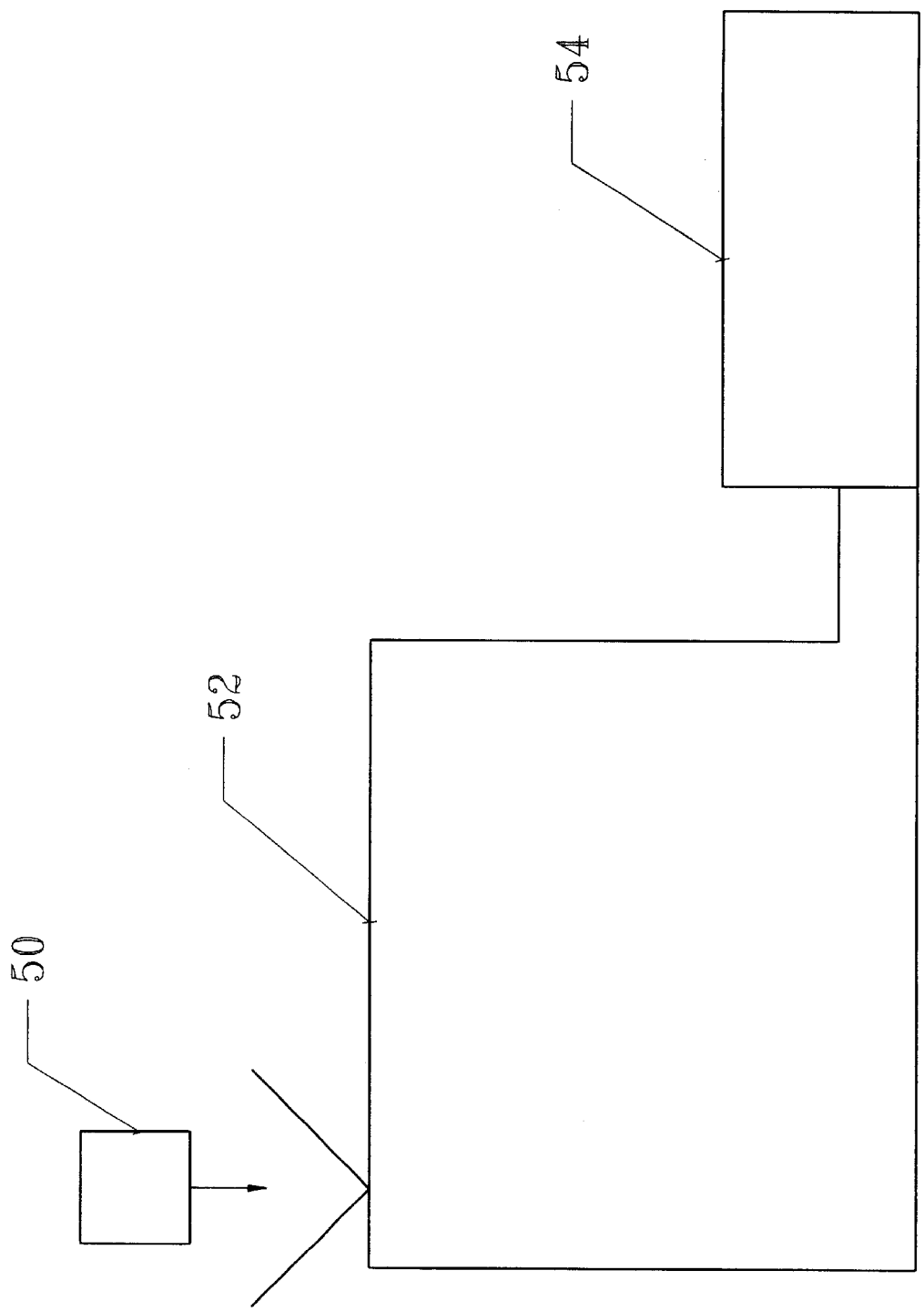
FIG. 12 is a schematic view of a thixomolding set-up.

FIG. 12 is a schematic view of the thixomolding process. FIG. 12 shows a material 50 which will be put into the thixotropic state, a thixomolding machine 52 and a mold 54.

Figure 13:
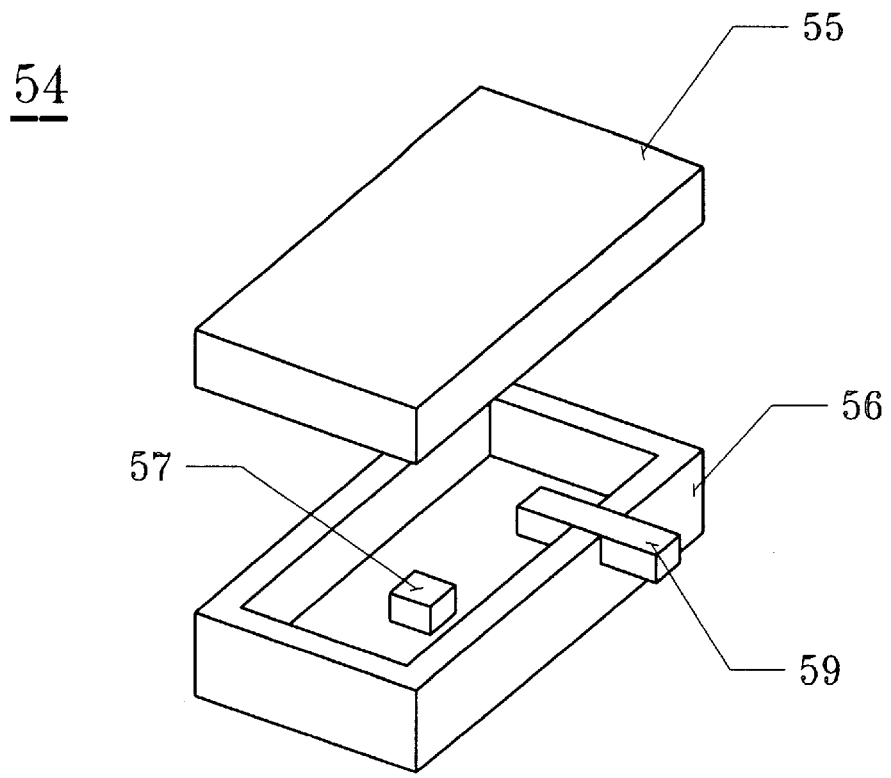
FIG. 13 is a perspective view of a mold having a first element therein and a second element partially therein.

FIG. 13 is a perspective view of the mold 54 having a first half 55 and a second half 56. The second half 56 is shown as having a first object or element 57 positioned inside the second half 56 of the mold 54 and a second object or element 59 positioned partially within the second half 56 of the mold 54. The second half 56 of the mold 54 has a cut-out in its side wall for receiving the second object 59. Such molding is known as insert molding, which is similar to that described above in regard to the covers 12 and 36.

Figure 14:
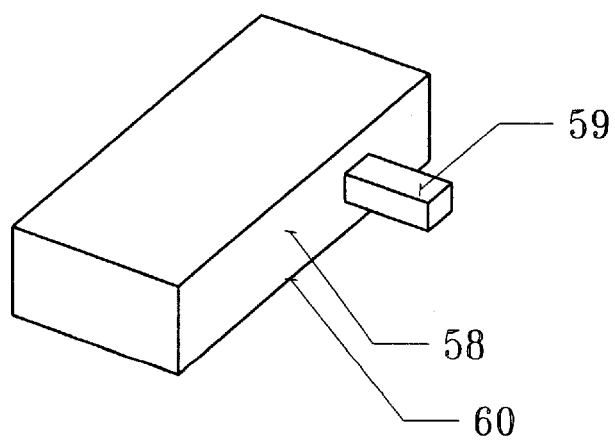
FIG. 14 is a perspective view of a molded part.

FIG. 14 is a perspective view of a molded part 58 created by the thixomolding process. The molded part 58 has a body 60 and the second object 59 sticking out from the body 60. The first object 57 is not seen in FIG. 14 since it is covered by the solidified thixotropic material of the body 60.

The objects inserted into the mold are presently metallic materials. However, it is envisioned that the objects can be constructed of ceramic, plastic, mineral, or other inorganic or organic substances. The mold is made of materials known to those skilled in the art.

The embodiment discussed above in regard to FIGS. 12–14 is representative of the insert molding capabilities of such a process. It is envisioned that this process can be used to manufacture reinforced components. Such components are needed in many industries, including the telecommunications industry. As an example, a hinge connecting the body of a hand-held, portable phone to the receiver is in need of being very small, yet having high strength and high stiffness so as to be robust.

It is also envisioned that the molded part 58 can later be used as an object that is placed fully or partially in another mold, in a secondary molding procedure, where other material is formed around the part 58 so as to construct more complicated, composite parts. As such, the molded part 58 can be molded first and then later plastic components, such as a plastic cover, can be overmolded onto the part such as a PC card metallic frame during a later step.

It is further envisioned that any of the edges of the first half 11 and the second half 30 of the package 10 such as shown in FIGS. 1–11 can have an opening or notch so as to accommodate a connector for an I/O device.

Obviously, numerous modifications and variations of the present invention are possible in light of the above teachings. It is therefore to be understood that within the scope of the appended claims, the invention may be practiced otherwise than as specifically described herein.

What is claimed is:

1. A method of assembling a peripheral device printed circuit board package having first and second electrically conductive covers made of a first metallic material, and first and second electrically conductive frames made of a second metallic material, each of the first and second electrically conductive covers having a perimeter, the method comprising the steps of:

placing the second metallic material into a molding machine;

converting the second metallic material to a thixotropic state;

transferring a first amount of the second metallic material in the thixotropic state to a first mold where the first amount of the second metallic material flows around a portion of the perimeter of the first electrically conductive cover so as to form the first electrically conductive frame attached to the perimeter of the first electrically conductive cover, where the first electrically conductive cover is electrically connected to the first electrically conductive frame;

transferring a second amount of the second metallic material in the thixotropic state to a second mold where the second amount of the second metallic material flows around a portion of the perimeter of the second electrically conductive cover so as to form the second electrically conductive frame attached to the perimeter of the second electrically conductive cover, where the second electrically conductive cover is electrically connected to the second electrically conductive frame; and bonding the first electrically conductive frame to the second electrically conductive frame, where the first electrically conductive frame is electrically connected to the second electrically conductive frame, and wherein, when the first frame is bonded to the second frame, the first and second covers do not physically contact each other.

2. The method of assembling a peripheral device printed circuit board package according to claim 1 wherein the step of transferring the first amount of the second metallic material in the thixotropic state to the first mold includes the first electrically conductive cover having a first side and a second side with a plurality of fingers extending from said sides and wherein edges of the first electrically conductive cover are bent to conform to a shape of the first electrically conductive frame and said fingers are embedded in the first electrically conductive frame forming an integral unit, the first amount of the second metallic material forming the first electrically conductive frame being molded around the fingers, and wherein the step of transferring the second amount of the second metallic material in the thixotropic state to the second mold includes the second electrically conductive cover having a first side and a second side with a plurality of fingers extending from said sides and wherein edges of the second electrically conductive cover are bent to conform to a shape of the second electrically conductive frame and said fingers are embedded in the second electrically conductive frame forming an integral unit, the second amount of the second metallic material forming the second electrically conductive frame being molded around the fingers.

3. A method of forming a part having an object bonded thereto, the method comprising the steps of:

placing a metallic material into a molding machine;

converting the metallic material to a thixotropic state;

inserting at least a portion of the object into a mold;

introducing the metallic material in the thixotropic state into the mold so as to have the metallic material flow around the portion of the object in the mold;

changing state of the metallic material in the thixotropic state to a solid state while being in the mold so as to form the part; and removing the part from the mold, the part having the object bonded thereto, and wherein the object is a cover of a peripheral device personal computer card package, and wherein the part is a frame member of the peripheral device personal computer card package having the cover bonded thereto.

4. A method of forming a part having an object bonded thereto, the method comprising the steps of:

placing a conductive material into a molding machine;

converting the conductive material to a thixotropic state;

inserting at least a portion of the object into a mold;

introducing the conductive material in the thixotropic state into the mold so as to have the conductive material flow around the portion of the object in the mold;

changing state of the conductive material in the thixotropic state to a solid state while being in the mold so as to form the part; and removing the part from the mold, the part having the object bonded thereto, and wherein the object is a cover of a peripheral device personal computer card package, and wherein the part is a frame member of the peripheral device personal computer card package having the cover bonded thereto.

* * * * *